(12) United States Patent  
Daval et al.

(10) Patent No.: US 8,367,521 B2
(45) Date of Patent: Feb. 5, 2013

(54) MANUFACTURE OF THIN SILICON-ON-INSULATOR (SOI) STRUCTURES

(75) Inventors: Nicolas Daval, Pleasantville, NY (US); Cecile Aulnette, Guilderland, NY (US)

(73) Assignee: Soitec, Bernin (FR)

( * ) Notice: Subject to any disclaimer, the term of this patent is extended or adjusted under 35 U.S.C. 154(b) by 149 days.

(21) Appl. No.: 12/956,547

(22) Filed: Nov. 30, 2010

(65) Prior Publication Data

US 2011/0140230 A1    Jun. 16, 2011

(30) Foreign Application Priority Data

Dec. 11, 2009   (EP) ..................................... 09290931

(51) Int. Cl.
*H01L 21/46* (2006.01)
*H01L 29/06* (2006.01)

(52) U.S. Cl. ........................................ 438/459; 257/625
(58) Field of Classification Search .................. 438/459, 438/464, 737, 761; 257/625, 676
See application file for complete search history.

(56) References Cited

U.S. PATENT DOCUMENTS

| 4,601,779 A | 7/1986 | Abernathey et al. .......... 156/628 |
| 5,013,681 A * | 5/1991 | Godbey et al. ................ 438/459 |
| 5,705,421 A * | 1/1998 | Matsushita et al. ........... 438/459 |
| 6,323,108 B1 | 11/2001 | Kub et al. ...................... 438/458 |
| 6,689,211 B1 * | 2/2004 | Wu et al. .......................... 117/94 |
| 6,940,089 B2 * | 9/2005 | Cheng et al. ..................... 257/19 |
| 2005/0170611 A1 | 8/2005 | Ghyselen et al. ............. 438/458 |

FOREIGN PATENT DOCUMENTS

| KR | 1995-0006967 | 6/1995 |
| WO | WO 91/05366 | 4/1991 |

OTHER PUBLICATIONS

KIPO Notice of Preliminary Rejection dated Oct. 24, 2011 with English Translation.

* cited by examiner

*Primary Examiner* — Calvin Lee
(74) *Attorney, Agent, or Firm* — Winston & Strawn LLP

(57) ABSTRACT

The present invention relates to a method of forming a SOI structure having a thin silicon layer by forming a first etch stop layer on a donor substrate, forming a second etch stop layer on the first etch stop layer, wherein the material of the second etch stop layer differs from the material of the first etch stop layer, forming a thin silicon layer on the second etch stop layer, preferably by epitaxy, and bonding the intermediate structure to a target substrate, followed by detaching the donor substrate by splitting initiated in the first etch stop layer at a weakened region and removing the remaining material of the etch stop layers to produce a final ETSOI structure. The invention also relates to the ETSOI structure produces by the described method.

18 Claims, 3 Drawing Sheets

MANUFACTURE OF THIN SILICON-ON-INSULATOR (SOI) STRUCTURES

FIELD OF INVENTION

The present invention relates to the manufacture of thin SOI devices and, particularly, the manufacture of double BOX structures by improved etch stop techniques.

BACKGROUND OF THE INVENTION

Fully depleted SOI devices are promising candidates in the future CMOS technology for the solution of the problem of the variability of the threshold voltage caused by random channel doping and short channel effects. These problems represent severe obstacles for further down-scaling. Alternative approaches comprise FinFET devices as well as Extremely Thin SOI (ETSOI) devices. The present invention relates to the improvement of the manufacture of the latter ones.

Currently, the vast majority of ETSOI wafers are manufactured using the Smart Cut® process. Those wafers are used to make chips with transistors operating in fully depleted mode. The uniformity of the thin silicon layers is crucial for the performance of the resulting ETSOI devices. In order to achieve a satisfactory uniformity of a thin silicon layer, an etch stop layer is deposited on a donor wafer and the thin silicon layer is grown on top of the etch stop layer. During the wafer transfer process the donor-wafer is bonded to a target wafer, for example, by a buried layer, particularly a buried oxide layer (BOX). Detachment is achieved either by splitting initiated in the silicon substrate of the donor wafer or splitting initiated in the etch stop layer. In the former case, remaining silicon above the etch stop layer is to be removed and subsequently the etch stop layer is also to be removed. When splitting is performed in the etch stop layer the step of removal of remaining silicon from the donor wafer is avoided.

If a boron-doped etch stop layer is provided, a sufficiently thick etch stop layer that allows for accurate control of the splitting initiated in the etch stop layer can readily be achieved. However, direct contact of the thin silicon layer to a boron-doped etch stop layer results in some diffusion of the boron dopants into the thin silicon layer thereby deteriorating the quality of the ETSOI configuration. On the other hand, if an SiGe layer is used as the etch stop layer, relaxation defects pose a severe problem for a thickness of the SiGe layer that would allow for splitting initiated in the SiGe etch stop layer. This is due to the fact that a relatively high Ge concentration is needed to provide for a sufficiently high etching selectivity. Thus, in this case splitting has to be performed in the bulk substrate of the donor wafer and the above-mentioned step of removal of silicon material remaining on the surface of the etch stop layer after the detachment cannot be avoided. What is more, etching of the remaining silicon necessarily results is some under-etching of the thin silicon layer at edges of and under the etch stop layer transferred to the target substrate.

In view of the above, it is an object of the present invention to provide a method for the manufacture of thin SOI devices wherein the etching problem is alleviated.

SUMMARY OF THE INVENTION

The present invention relates to a SOI structure having a thin silicon layer of unprecedented uniformity, and the process for manufacturing such a structure using two etch stop layers made of different materials. The presently disclosed use of two etch stop layers, where each is made of a different material, is contrary to the prior art and advantageous for the manufacture of new and useful SOI structures.

The method of forming a SOI structure having a thin or extremely thin silicon layer comprises; forming a first etch stop layer on a donor substrate, wherein the first etch stop layer comprises boron doped silicon; forming a second etch stop layer on the first etch stop layer, wherein the second etch stop layer comprises a SiGe layer, such that the material of the second etch stop layer differs from the material of the first etch stop layer; forming a thin silicon layer on the second etch stop layer to form an intermediate structure; and bonding this first intermediate structure to a target substrate; and detaching the donor substrate from the other layers of the first intermediate structure by initiating a splitting within the first etch stop layer, where the first etch stop layer divides into two parts, in which one part remains attached to the second etch stop layer, and the other part remains attached to the donor substrate.

The method may further comprise removing any of the remaining material of the first etch stop layer from the second etch stop layer by etching after the detachment of the donor substrate; and subsequently removing the second etch stop layer by etching. The second etch stop layer, which is a SiGe layer, comprises at least 15% Ge, and more preferably at least 20% Ge, or most preferably at least 25% Ge. The thickness of the second etch stop layer is less than the thickness of the first etch stop layer.

The method further comprises implanting ions, where the ions may be hydrogen ions, into the first etch stop layer in order to form a weakened region, and wherein splitting occurs at the weakened region.

The thin silicon layer is formed at a thickness of at most 20 nm, preferably at most 15 nm, and more preferably at most 10 nm, wherein the thin silicon layer may be formed by epitaxial growth on the second etch stop layer.

The method may further comprise forming additional layer(s) on either the thin silicon layer or the target substrate or both before bonding the first intermediate structure to the target substrate, wherein the bonding is facilitated by the one or more additional layer(s). The additional layer(s) may be oxide layers that become a buried oxide layer after bonding.

A first additional layer can be formed on the thin silicon layer; followed by forming a silicon comprising layer also comprising boron dopants on the first additional layer, wherein the silicon comprising layer can be an amorphous or polycrystalline silicon layer, or an amorphous or polycrystalline SiGe layer; forming a second additional layer on the silicon comprising layer before the bonding step; and bonding the second additional layer to the target substrate to form a buried layer. The method may then further comprise forming a third additional layer on the target substrate before the bonding step; and bonding the second additional layer to the third additional layer formed on the target substrate to form a buried layer. The method may also comprise forming a boron diffusion barrier layer on the first additional layer and/or on the silicon comprising layer, wherein the barrier layer is made of $Si_3N_4$, to prevent diffusion of boron into adjacent layers, such as the buried oxide layers.

In another embodiment, the method can further comprise forming a first additional layer on the thin silicon layer; forming a second additional layer on the target substrate; forming a silicon comprising layer also comprising boron dopants on the second additional layer; forming a third additional layer on the silicon comprising layer to form a second intermediate structure before the bonding step; and bonding the first additional layer to the third additional layer, such that the first intermediate structure and second intermediate structure are bonded at their free surfaces to form a final structure. The additional layers can be oxide layers that become a buried oxide layer after bonding or the subsequent formation of additional layers. The method can further comprise forming a boron diffusion barrier layer on the second additional layer and/or on the silicon comprising layer to prevent diffusion into the thin silicon layer.

BRIEF DESCRIPTION OF THE DRAWINGS

Other features and advantages of the present invention will become apparent from the following description of particular non-limiting embodiments of the invention in conjunction with the accompanying drawings, in which.

DETAILED DESCRIPTION OF THE INVENTION

Figure 1:
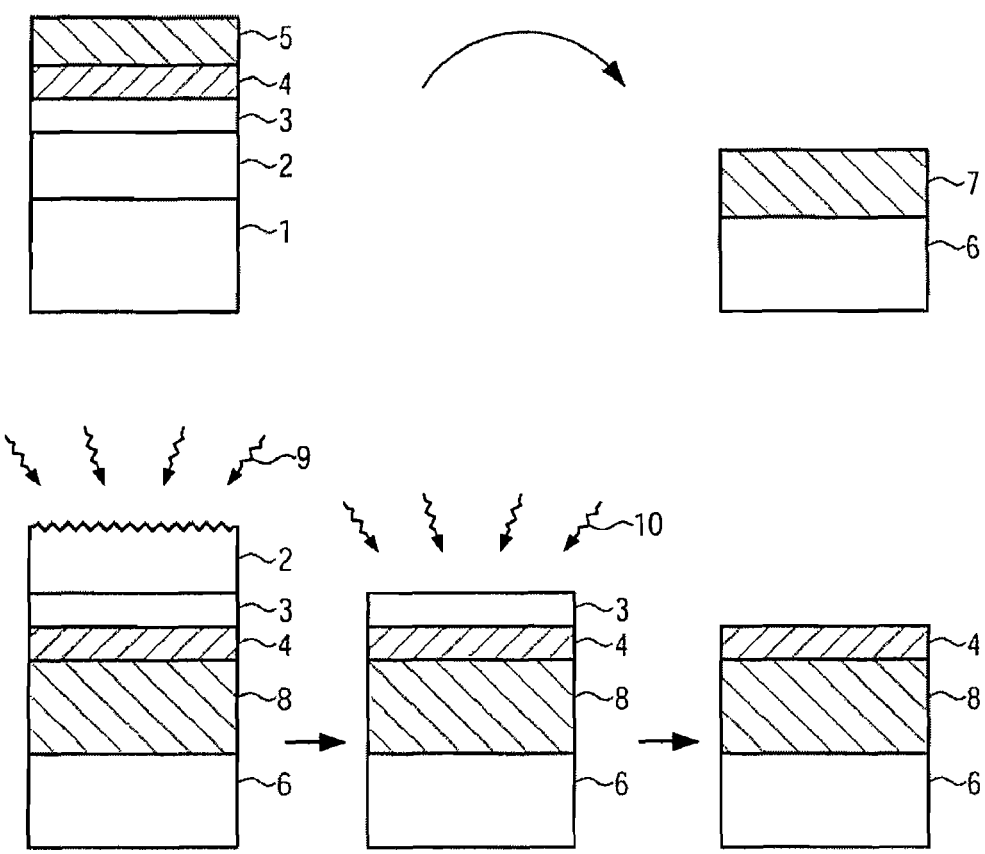
FIG. 1 illustrates an example of the inventive method according to a preferred embodiment including the formation of two etch stop layers.

The present invention relates to producing a final multi-layer or composite structure by one of the described embodiments of the disclosed methods having a configuration that includes at least two etch stop layers, each made from a different material, and at least a thin silicon layer of unprecedented uniformity. Other embodiments may further comprise at least one buried oxide layer, a boron doped polycrystalline silicon layer, and/or a thin interlayer made of $Si_3N_4$.

The silicon layer qualifies to be characterized as thin by having a thickness of at most 20 nm, preferably at most 15 nm, and more preferably at most 10 nm.

According to the present invention two different etch stop layers are provided on a donor substrate and a thin or extremely thin silicon layer is grown atop the free surface of one of these etch stop layers (the upper one with respect to the thin silicon layer), where the materials of the etch stop layers provide etching selectivity with respect to the thin silicon layer. Accordingly, one of the etch stop layers (the lower one with respect of the thin silicon layer) is used for splitting after bonding of the stack comprising the donor substrate, the etch stop layers and the thin silicon layer to a target substrate or wafer. This first etch stop layer used for the splitting preferably includes boron, and can be readily formed, either by being grown or deposited, to a thickness that allows for ion implantation and an accurately controllable splitting.

The first etch stop layer can be a boron doped silicon layer. The other (second) etch stop layer is advantageously free of any dopants that could be accepted by the thin silicon layer, where the dopants may enter the thin layer through diffusion for example. The second etch stop layer can be an SiGe layer that may comprise at least 15%, preferably at least 20% or more preferably at least 25% Ge, for example. In addition, the second etch stop layer also serves as a diffusion barrier layer against boron when boron dopants are included in the first etch stop layer. Thus, according to the present invention contamination of the thin silicon layer by dopants, for example, boron dopants, included in the first etch stop layer used for splitting after the bonding process can be avoided.

According to one embodiment, the inventive method comprises implanting ions into the first etch stop layer used for the splitting process in order to form a weakened region. In this case, the step of splitting includes splitting at the weakened region by heat treatment. Thereby, detachment of the donor substrate can reliably be controlled. In particular, the splitting process may be carried out utilizing the steps of the Smart Cut® process.

The SiGe layer also can be formed with a lower thickness than the first etch stop layer, since ion implantation and splitting does not occur within this second etch stop layer. Since the second etch stop layer is not used for the splitting process it can be formed with such a sufficiently low thickness that relaxation defects after some heat treatment can be avoided.

In addition, both the first and the second etch stop layer advantageously exhibit a significant etching selectivity with respect to the silicon of the thin silicon layer. Thereby, no under-etching of the thin silicon layer is caused during removal of both the material of the first etch stop layer remaining atop of the second etch stop layer after the splitting process is performed, or the material of the second etch stop layer after splitting and removal of the first etch stop layer, to provide for a uniform exposed thin silicon layer appropriate for the further manufacturing of a thin SOI device (ETSOI device) that might include growing additional material layers, etc. The thickness uniformity of the thin silicon layer of the ETSOI wafer is therefore only defined by the thickness uniformity performance of the epitaxy when this layer is grown on the donor substrate.

It should be noted that if the first etch stop layer is a boron doped silicon layer, it can be removed (remaining material of this layer can be removed) after wafer transfer by etching with an etchant comprising HF:HNO3. If the second etch stop layer is an SiGe layer, it can be removed after wafer transfer by etching by an etchant comprising HF:H2O2 (e.g. HF:H2O2:CH3COOH).

The thin or extremely thin silicon layer is epitaxially grown on the second etch stop layer in a manner known in the art to provide suitable thickness uniformity.

The step of bonding an intermediate structure having a particular configuration to the target substrate may be performed in a conventional manner, and may include some form of heat treatment as known in the art.

The bonding step may be mediated by forming an additional layer, in particular, an oxide layer, on the thin silicon layer before the bonding step and/or forming a second additional layer, in particular a second oxide layer, on the target substrate before the bonding step. After formation of the additional layer(s), the intermediate structure comprising the donor substrate plus the etch stop layers, the thin silicon layer and the first additional layer are bonded to the target substrate to form a final structure having a buried layer, where the buried layer is preferably a buried oxide (BOX) layer. The presence of one or more additional layers, and in particular oxide layers, facilitates bonding of the intermediate structure to the target substrate, or between a first intermediate structure and a second intermediate structure.

According to another particular embodiment, the inventive method further comprises forming a silicon comprising layer comprising boron dopants on the surface of the first additional layer; forming a second additional layer on the silicon comprising layer before the bonding step; and bonding the second additional layer to the target substrate, wherein a third additional layer may be formed on the target substrate. Subsequently, the second additional layer is bonded to the third additional layer formed on the target substrate to produce the final structure. In each case, the additional layers are preferably oxide layers that can become buried oxide layers after the formation of subsequent layers or bonding.

The above-mentioned silicon comprising layer provides support for the oxide layer formed thereon and, advantageously, has a work function similar to silicon. Appropriate choices for the silicon comprising layer are amorphous or polycrystalline silicon or amorphous or polycrystalline SiGe, for example.

According to a further alternative embodiment, the inventive method comprises the steps of forming a first additional layer on the thin silicon layer before the bonding step; forming a second additional layer on the target substrate before the bonding step; forming a silicon comprising layer also comprising boron dopants on the second buried oxide layer before the bonding step; forming a third additional layer on the silicon comprising layer before the bonding step; and bonding the first additional layer to the third additional layer to form the final structure having a buried layer.

After bonding the intermediate structure to the target substrate, the donor wafer is detached from the final structure by initiating splitting within the first etch stop layer. After splitting, a portion of the first etch stop layer remains on the donor wafer and a portion of the first etch stop layer remains on the second etch stop layer. The material of the first etch stop layer must then be removed from the second etch stop layer, after which the second etch stop layer is removed to expose the thin silicon layer.

After detachment and removal of the remaining material of the first etch stop layer and removal of the second etch stop layer, this particular embodiment results in a double BOX structure comprising an exposed thin silicon layer.

According to all mentioned alternatives, reliable bonding can be achieved that is followed by the step of splitting in the first etch stop layer. Moreover, a boron diffusion barrier layer can be formed directly on the upper and/or lower surface of the silicon comprising layer, i.e. between the silicon comprising layer and the respective buried oxide layers.

By the above-described methods a thin silicon layer for the manufacture of ETSOI devices is provided with an unprecedented uniformity for a thickness of the silicon layer of at most 20 nm, preferably 10 nm, more preferably at most 5 nm.

Additional features and advantages of the present invention will be described with reference to the drawings. In the following detailed description, reference is made to the accompanying figures that are meant to illustrate preferred embodiments of the invention. It is understood that such embodiments do not represent the full scope of the invention, for which reference should be made to the claims.

FIG. 1 depicts a preferred embodiment of the inventive method, wherein wafer transfer is mediated by a splitting process that is initiated in one of two provided etch stop layers. As shown in FIG. 1, a first etch stop layer 2 is grown on a donor substrate 1. A second etch stop layer 3 is grown atop of the first etch stop layer 2. A very thin silicon layer 4 is formed on the upper surface (also referred to as an exposed or free surface) of the second etch stop layer 3. A first oxide layer 5 is formed atop of the thin silicon layer 4 to form a first intermediate structure, wherein this layer will become at least a portion of a buried oxide (BOX) layer after wafer transfer. A target substrate 6 is covered by a second oxide layer 7. Bonding of the first 5 and the second 7 oxide layers results in the formation of a buried oxide (BOX) layer 8. The resulting structure then undergoes a wafer transfer process to the target substrate 6 covered by and buried oxide layer 8. Detachment is achieved by a splitting initiated in the first etch stop layer 2 after the process of bonding of the first 5 and the second 7 oxide layers to form the buried oxide layer 8. Since splitting is initiated in the first etch stop layer 2, after detachment some material of the first etch stop layer 2 remains atop of the second etch stop layer 3.

In order to achieve a free surface of the thin silicon layer 4 that is to be provided for subsequent steps of the manufacture of a semiconductor device, particularly an ETSOI device, the remaining material of the first etch stop layer 2 is etched in a first etching process 9. This first etching process 9 is advantageously highly selective with respect to the thin silicon layer 4 to avoid damage. After the remaining material of the first etch stop layer 2 has been completely removed, a second etching process 10 is performed in order to remove the second etch stop layer 3 from the surface of the thin silicon layer 4. The second etching process 10 is also highly selective with respect to the thin silicon layer 4. After removal of the first etch stop layer 2 and the second etch stop layer 3, the final desired ETSOI structure comprising a target substrate 6, the buried oxide layer 8 resulting from bonding of the first 5 and the second 7 oxide layers and the thin silicon layer 4 is achieved as it is illustrated in FIG. 1.

In the preferred embodiment the donor substrate 1 may be a common silicon substrate. The first etch stop layer 2 is a boron doped silicon, and the second etch stop layer 3 is a SiGe layer. The second etch stop layer should preferably have a Ge content of more than 20%, and is sufficiently thin to substantially avoid relaxation defects.

The thickness of the thin silicon layer 4 may be at most approximately 20 nm, and preferably between 5 nm and 15 nm. It is also crucial that the thin silicon layer 4 is grown as uniform as possible, preferably by epitaxy.

The oxide layer(s) 5, 7 formed on the thin silicon layer 4 and target substrate 6 facilitate the bonding and wafer transfer.

In each of the various embodiments, the target substrate 6 may be made of the same material as the donor substrate 1.

Splitting is initiated after bonding of the first and second oxide layers has been completed, thereby resulting in the formation of the buried oxide layer 8. The splitting may be initiated by any known conventional method comprising, for example, an appropriate heat treatment. For example, the Smart Cut® process may be performed (see also description below).

The remaining material of the first etch stop layer 2 is removed by a process that is advantageously highly selective with respect to the thin silicon layer 4 to avoid damage. Removal of the boron-doped-silicon etch stop layer can be achieved by an etchant comprising $HF:HNO_3$.

The second etch stop layer 3 is removed from the surface of the thin silicon layer 4 by a process that is also highly selective with respect to the thin silicon layer 4 to avoid damage. For this reason, a relative high Ge content is provided in the case of a SiGe layer used for the second etch stop layer (see above). Removal of the second etch stop layer 3 can be achieved by an etchant comprising $HF:H_2O_2$ (e.g. $HF:H_2O_2:CH_3COOH$).

Another embodiment of the inventive method will now be described with reference to FIG. 2. Similar to the example shown in FIG. 1, a first etch stop layer 2 and a second etch stop layer 3 are formed on a donor substrate 1. A weakened layer 11 is formed by the implantation of ions in the first etch stop layer 2. A thin silicon layer 4 is grown on top of the second etch stop layer 3. A first oxide layer 5 is formed on top of the thin silicon layer 4. In contrast to the example shown in FIG. 1, the first oxide layer 5 is not used for bonding with a second oxide layer 7 grown on a target substrate 6. Instead, a polycrystalline silicon layer 12 doped with boron is subsequently formed on top of the first oxide layer 5 to make oxide layer 5 a buried oxide layer. A third oxide layer 13 is formed on top of the polycrystalline silicon layer 12 doped with boron to mediate bonding to the second oxide layer 7 formed on the target wafer 6. Bonding results in a combined buried oxide layer 14 comprising the bonded oxide layers 7 and 13. Detachment and layer transfer is again achieved by splitting initiated within the first etch stop layer 2, where splitting occurs particularly at the weakened layer 11.

Figure 2:
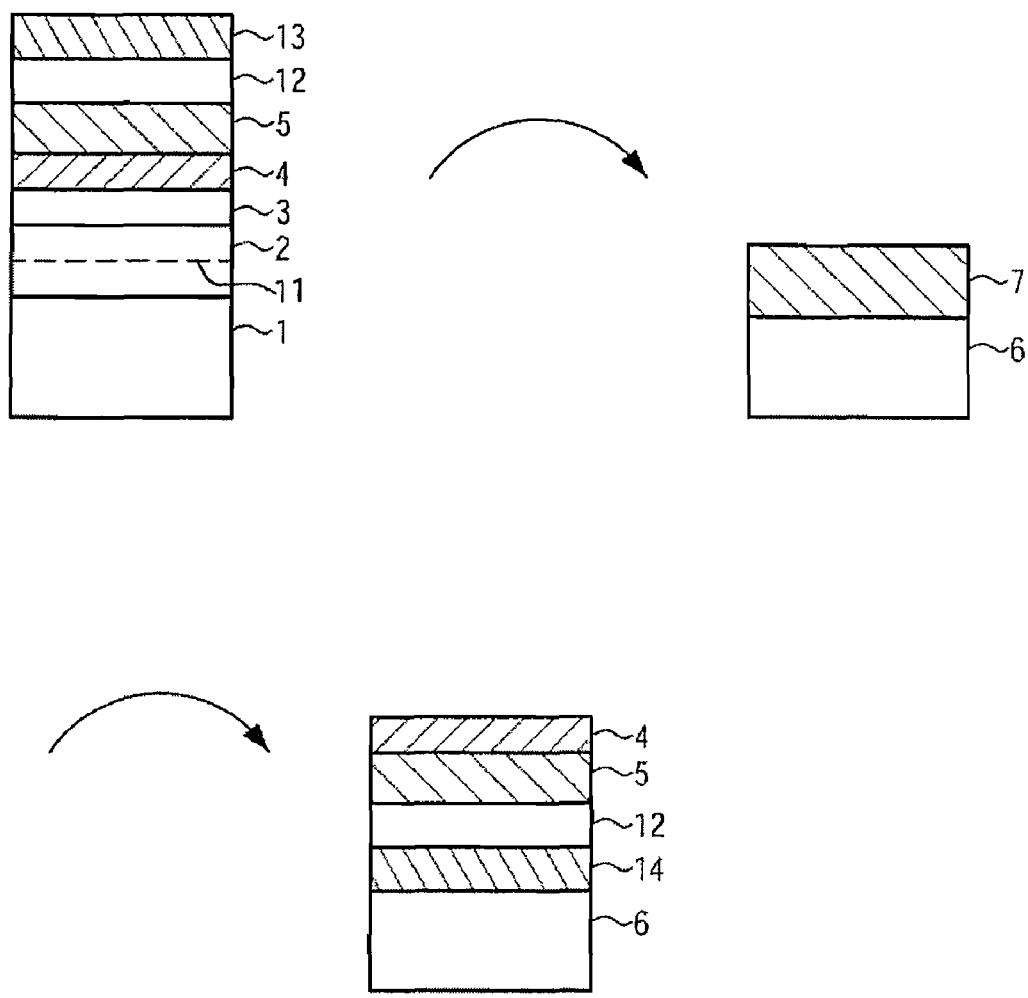
FIG. 2 illustrates an example of the inventive method according to a second embodiment having a double BOX configuration.

As it is further shown in FIG. 2, after detachment of the donor substrate 1 and removal of remaining material of the first etch stop layer 2 and complete removal of the second etch stop layer 3, a final double BOX configuration comprising the target substrate 6, the combined BOX layer 14, the polycrystalline silicon layer 12 doped with boron, the first BOX layer 5 and the thin silicon layer 4 is obtained in this order.

In one example, both the first box layer 5 and the thin silicon layer 4 may have a thickness of preferably between 5 nm to 15 nm, and more preferable approximately 10 nm.

The doped polycrystalline silicon layer 12, preferably has a boron concentration of approximately $10^{18}$ to $10^{19}$ cm$^{-3}$.

The weakened layer is formed in the first etch stop layer by the implantation of ions, which may be for example hydrogen ions.

Figure 3:
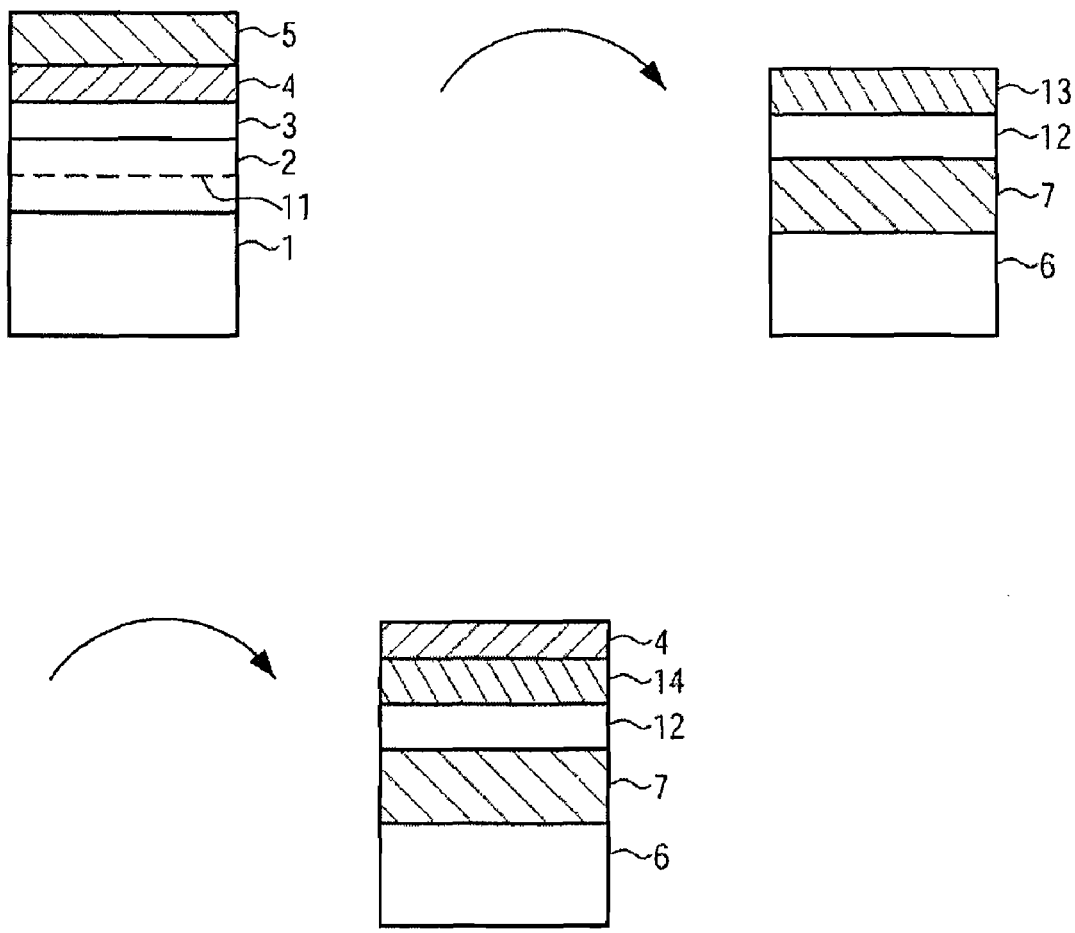
FIG. 3 illustrates another example of the inventive method according to an embodiment also including a double BOX configuration.

A double BOX configuration can alternatively be obtained as it is illustrated in FIG. 3. In this example, layers 12 and 13 of FIG. 12 are not formed on the donor wafer, rather, a polycrystalline silicon layer 12 and another buried oxide layer 13 are formed on a buried oxide layer 7 formed on a target substrate 6 to produce a second intermediate structure. After bonding buried oxide layers 5 and 13, detachment by splitting initiated in the first etch stop layer 2 and removal of the remaining material of the first etch stop layer 2 and the second etch stop layer 3 from the thin silicon layer 4, a double BOX configuration with the buried oxide layer 7 and the buried oxide layer 14 resulting from bonding of the buried oxide layers 5 and 13 is obtained.

Furthermore, in the embodiments illustrated in FIGS. 2 and 3, it might be preferable to form a thin interlayer consisting of $Si_3N_4$ between the buried oxide layer 5 and the polycrystalline silicon layer 12, and between the polycrystalline silicon layer 12 and the buried oxide layer 13 (FIG. 2) or between the buried oxide layer 7 and the polycrystalline silicon layer 12, and between the polycrystalline silicon layer 12 and the buried oxide layer 13 (FIG. 3), respectively, as a barrier. Diffusion of the small boron atoms from the doped polycrystalline silicon layer 12 to the buried oxide layers can, thereby, be prevented.

The resulting structures shown in FIGS. 1, 2 and 3 can readily be used for microchip manufacture based on ETSOI, in particular, for the manufacture of transistor devices in 22 nm technology and below. Compared to the prior art, the inventive method disclosed herein achieves an unexpected and unprecedented uniformity of the thin silicon layer. The uniformity of the thin silicon layers is crucial for the performance of the resulting ETSOI devices.

According to one particular example, the inventive method comprises; forming a first buried oxide layer on the thin silicon layer before the bonding step; forming a silicon comprising layer comprising boron dopants on the first buried oxide layer before the bonding step; forming second buried oxide layer on the silicon comprising layer before the bonding step; and bonding the second buried oxide layer to the target substrate.

According to another example, the inventive method comprises; forming a first buried oxide layer on the thin silicon layer before the bonding step; forming a silicon comprising layer comprising boron dopants on the first buried oxide layer before the bonding step; forming second buried oxide layer on the silicon comprising layer before the bonding step; and forming a third buried oxide layer on the target substrate. Subsequently, the second buried oxide layer is bonded to the third buried oxide layer formed on the target substrate.

According to a further alternative, the inventive method comprises the steps of forming a first buried oxide layer on the thin silicon layer before the bonding step; forming a second buried oxide layer on the target substrate before the bonding step; forming a silicon comprising layer comprising boron dopants on the second buried oxide layer before the bonding step; forming a third buried oxide layer on the silicon comprising layer before the bonding step; and bonding the first buried oxide layer to the third buried oxide layer. After detachment and removal of the remaining material of the first etch stop layer and removal of the second etch stop layer a double BOX structure comprising an exposed thin silicon layer results.

All previously discussed embodiments are not intended as limitations but to serve as examples illustrating features and advantages of the invention. It is to be understood that some or all of the above described features can be combined in different ways and in different configuration while remaining within the spirit and scope of the present invention.

What is claimed is:

1. A method of forming a SOI structure having a thin silicon layer comprising:
   forming a first etch stop layer on a donor substrate;
   forming a second etch stop layer on the first etch stop layer, wherein the second etch stop layer comprises a material that differs from that material of the first etch stop layer, is in contact with the first etch stop layer, and has a thickness that is sufficiently thin to substantially avoid relaxation defects;
   forming a thin silicon layer on the second etch stop layer to form an intermediate structure;
   bonding the intermediate structure to a target substrate; and
   detaching the donor substrate by applying a heat treatment to initiate splitting within the first etch stop layer.

2. The method according to claim 1, which further comprises removing any remaining material of the first etch stop layer from the second etch stop layer after the detaching of the donor substrate; and subsequently removing the second etch stop layer.

3. The method according to claim 1, wherein the first etch stop layer comprises boron doped silicon.

4. The method according to claim 1, wherein the second etch stop layer comprises a SiGe layer.

5. The method according to claim 4, wherein the SiGe layer comprises at least 15% Ge.

6. The method according to claim 1, which further comprises implanting ions into the first etch stop layer in order to form a weakened region, and wherein the splitting occurs at the weakened region.

7. The method according to claim 1, wherein the second etch stop layer has a thickness that is less than that of the first etch stop layer.

8. The method according to claim 1, wherein the thin silicon layer is formed at a thickness of at most 10 nm.

9. The method according to claim 8, wherein the thin silicon layer is formed at a thickness of at most 5 nm.

10. The method according to claim 1, which further comprises; forming additional layer(s) on either the thin silicon layer or the target substrate or both before bonding the intermediate structure to the target substrate, wherein the bonding is facilitated by the one or more additional layer(s).

11. The method according to claim 10, wherein the additional layer(s) comprise oxide layers that become a buried oxide layer after bonding.

12. The method according to claim 1, which further comprises;
    forming a first additional layer on the thin silicon layer;
    forming a silicon comprising layer also comprising boron dopants on the first additional layer;
    forming a second additional layer on the silicon comprising layer before the bonding step; and
    bonding the second additional layer to the target substrate to form a buried layer.

13. The method according to claim 12, wherein the silicon comprising layer is an amorphous or polycrystalline silicon layer, or an amorphous or polycrystalline SiGe layer.

14. The method according to claim 12, further comprising forming a boron diffusion barrier layer on the second additional layer or on the silicon comprising layer.

15. The method according to claim 12, further comprising forming a third additional layer on the target substrate before the bonding step; and
    bonding the second additional layer to the third additional layer formed on the target substrate to form a buried layer.

16. The method according to claim 15, which further comprises forming a boron diffusion barrier layer on the first additional layer or on the silicon comprising layer.

17. The method according to claim 1, which further comprises;
    forming a first additional layer on the thin silicon layer;
    forming a second additional layer on the target substrate;
    forming a silicon comprising layer also comprising boron dopants on the second additional layer;
    forming a third additional layer on the silicon comprising layer before the bonding step; and
    bonding the first additional layer to the third additional layer.

18. The method according to claim 17, wherein the additional layer(s) are oxide layers that become a buried oxide layer after bonding or the subsequent formation of additional layers.

* * * * *